United States Patent [19]

Towers et al.

[11] Patent Number: 4,584,488
[45] Date of Patent: Apr. 22, 1986

[54] CONTROLLER FOR GENERATING A PAIR OF MUTUALLY EXCLUSIVE PULSE TRAIN SIGNALS

[75] Inventors: Kenneth S. Towers, Royal Oak; William C. Eddy, West Bloomfield, both of Mich.

[73] Assignee: Allied Corporation, Morris Township, Morris County, N.J.

[21] Appl. No.: 670,687

[22] Filed: Nov. 13, 1984

[51] Int. Cl.[4] .......................... H03K 3/00; B62D 5/06
[52] U.S. Cl. ..................... 307/106; 180/140; 180/141; 180/142; 74/484 R; 361/168.1
[58] Field of Search .............. 307/106; 361/166, 167, 361/168.1, 169.1, 170, 179; 74/484 R, 486, 495, 496, 501.5 R; 180/136, 141, 142, 140

[56] References Cited

U.S. PATENT DOCUMENTS

| 3,939,938 | 2/1976 | Inoue | 180/142 |
|---|---|---|---|
| 4,392,540 | 7/1983 | Michio et al. | 180/142 |
| 4,408,673 | 10/1983 | Leiber | 180/141 |
| 4,418,779 | 12/1983 | Nakayama et al. | 180/141 |
| 4,448,275 | 5/1984 | Kitagawa et al. | 180/142 X |
| 4,456,087 | 6/1984 | Lang et al. | 180/142 |
| 4,473,128 | 9/1984 | Nakayana et al. | 180/142 |
| 4,476,954 | 10/1984 | Johnson et al. | 74/471 R X |
| 4,530,414 | 7/1985 | Fukino et al. | 180/142 |

FOREIGN PATENT DOCUMENTS

| 0090294 | 10/1983 | European Pat. Off. | 180/142 |
|---|---|---|---|
| 0141970 | 8/1983 | Japan | 180/142 |
| 1379606 | 1/1975 | United Kingdom | 180/141 |
| 1435968 | 5/1976 | United Kingdom | 180/142 |
| 2119326 | 11/1983 | United Kingdom | 180/141 |

Primary Examiner—William M. Shoop, Jr.
Assistant Examiner—Shik Luen Paul Ip
Attorney, Agent, or Firm—James Ignatowski; Russel C. Wells

[57] ABSTRACT

An electronic controller for generating a pair of mutually exclusive pulse train signals. The controller having an offset generator for biasing the input signal about a midpoint value, a first and second difference amplifier for generating a first and second difference signal, one difference signal corresponding to the difference between the biased input signal and the midpoint value and the other difference signal corresponding to the inverted difference between the biased input signal and the midpoint value, a saw tooth wave generator generating a saw tooth wave having its valleys clipped to a predetermined value, and a pair of comparators, one generating a pulse train signal in response to the saw tooth wave and the first difference signal and the other generating the second pulse train signal in response to the saw tooth wave and the second difference signal.

17 Claims, 13 Drawing Figures

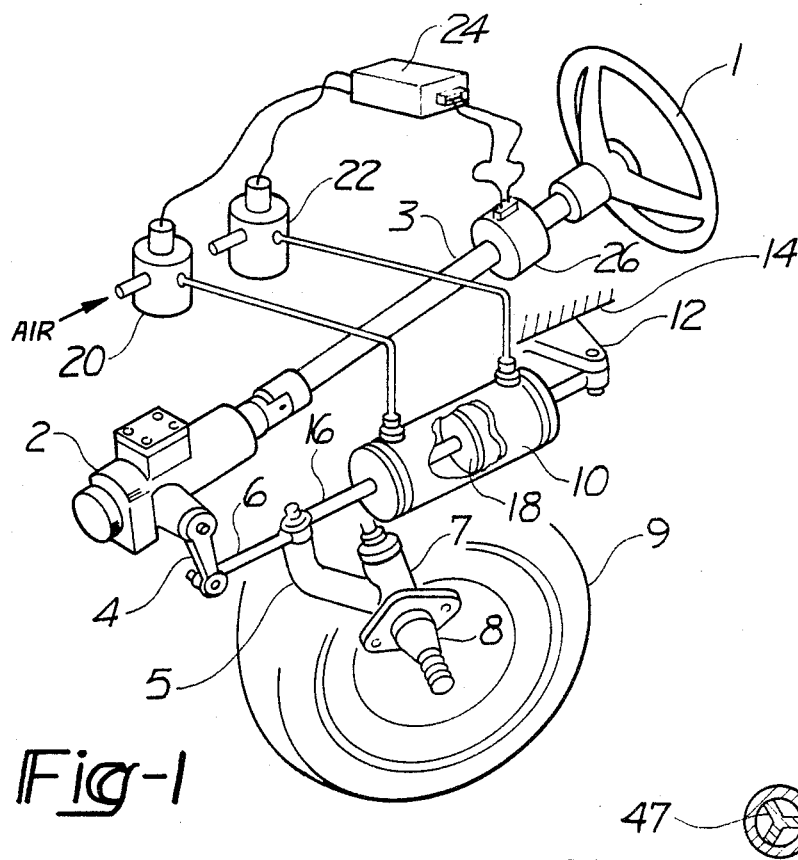
Fig-1
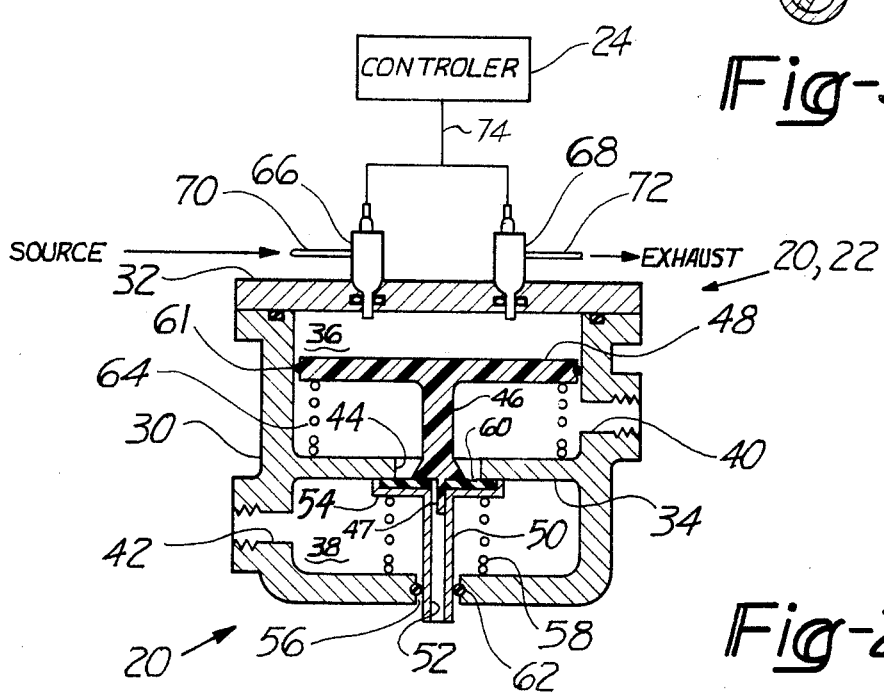
Fig-3
Fig-2

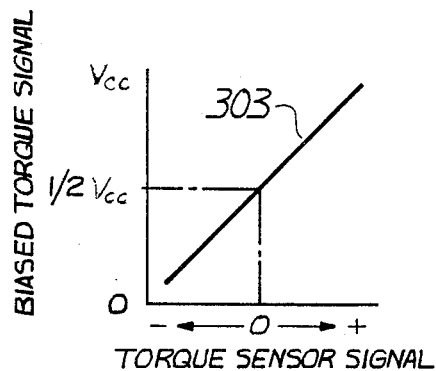
Fig-9
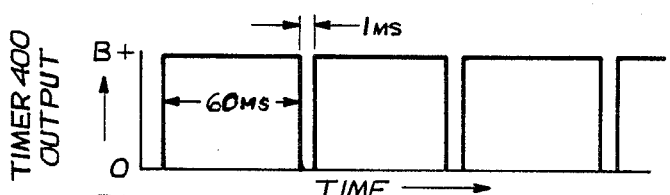
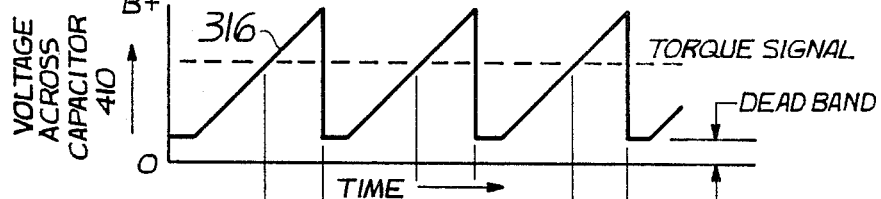
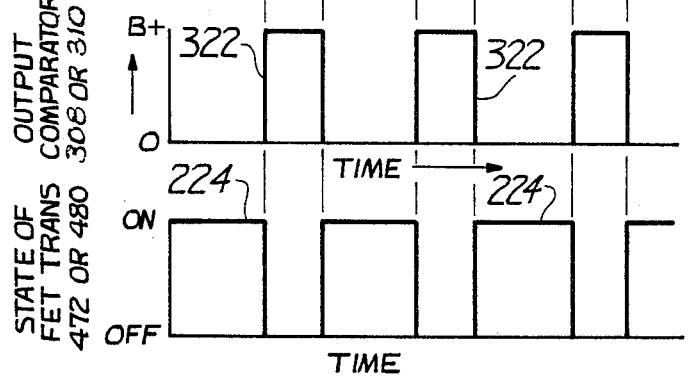

CONTROLLER FOR GENERATING A PAIR OF MUTUALLY EXCLUSIVE PULSE TRAIN SIGNALS

CROSS REFERENCE

The disclosed invention is related to commonly assigned co-pending applications Ser. Nos. 670,688 and 670,686 filed concurrently herewith.

BACKGROUND OF THE INVENTION

1. Field of the Invention

The invention is an electronic controller and in particular an electronic controller for generating a pair of mutually exclusive pulse train signals in response to an input signal.

2. Prior Art

The use of electronic controllers for generating pulse train signals to actuate electrically controlled devices, is well known in the art. Typically these types of controllers are used to actuate solenoid devices, such as the injector valves in automotive fuel injector systems or fluid actuated positioning devices. Many of the controlled systems use two solenoid valves which operate in a complimentary manner such that when one is open the other is closed and vice versa. Therefore the controller is required to generate two pulse train signals, one for each of the two valves. Normally one of these two pulse train signals is the logical compliment of the other. However, in some controlled systems, such as the electro/pneumatic power system described herein, the generated pulse train signals are required to be mutually exclusive depending upon the state of the input signal such that only one or the other of the solenoid valves are actuated, but not together.

The invention is an electronic controller for independently actuating a pair of electrically actuated devices in a mutually exclusive manner depending upon the state of the input signal.

SUMMARY OF THE INVENTION

The invention is an electronic controller for generating two mutually exclusive pulse train signals in response to the direction and magnitude components of an input signal. The electronic controller comprises an amplifier responsive to an input signal to generate an amplified signal, offset bias generator means for biasing the amplified signal about a midpoint value to generate a biased signal, saw tooth generator means for generating a saw tooth wave, deadband generator means for generating a clipping signal having a predetermined value, a clipping amplifier responsive to the saw tooth wave and clipping signal to generate a clipped saw tooth wave having a minimum value limited to the predetermined value, reference signal means for generating reference signals having values corresponding to the midpoint value, a first difference amplifier for generating a first difference signal having an amplitude proportional to the difference between the biased signal and said reference signal; a second difference amplifier for generating a second difference signal having an amplitude inversely proportional to the difference between the biased signal and the reference signal. The controller further has first comparator means for generating a first pulse wave train in response to the first difference signals having an amplitude greater than the instantaneous amplitude of the limited saw tooth wave, each pulse in the first pulse train wave having a duration proportional to the amplitude of the first difference signal and second comparator means for generating the second pulse wave train in response to the second difference signal having an amplitude greater than the instantaneous amplitude of the limited saw tooth wave, each pulse in the second pulse wave train having a duration proportional to the amplitude of the second difference signal.

One advantage of the controller is that the two generated pulse wave trains are mutually exclusive. Another advantage is that the duration of each pulse in the first and second pulse wave trains are proportional to the magnitude component of the input signal. Still another advantage is that the limited saw tooth wave produces a deadband about a zero value input signal in which neither the first nor the second pulse train signals are generated. These and other advantages of the controller will become more apparent from a reading of the specification in conjunction with the drawings.

BRIEF DESCRIPTION OF THE DRAWINGS

FIG. 1 is a cut-away perspective of the electro/pneumatic power steering system

FIG. 2 is a cross-sectional view of the electro/pneumatic proportional valve in a static state FIG. 3 is a partial cross section showing the configuration of the pintle's guide finger FIG. 9 is a graph showing the relationship of the torque signals to the offset signal FIG. 10a through 10d are the waveforms generated by at various points in the electronic controller circuit

DETAILED DESCRIPTION OF THE DRAWINGS

Figure 4:
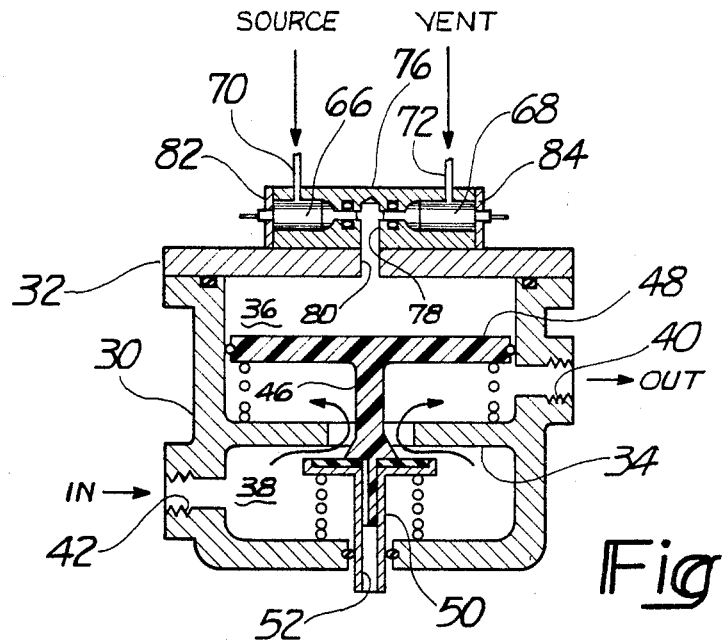
FIG. 4 is a cross-sectional view of the electro/pneumatic proportional valve in an open state

FIG. 1 is a cut-away perspective showing the relationship of the elements of the electro/pneumatic power steering system to the steering mechanism of an automotive vehicle which has a source of pressurized air (not shown). As is known in the art, the vehicle's steering mechanism comprises a steering wheel 1 which is connected to a steering box 2 by a steering column 3. The steering box 2 has a Pittman arm 4 rotatably displaceable in response to the turning of the steering wheel 1. The Pittman arm 4 is connected to the front wheel's steering arm 5 by means of a tie rod 6. The steering arm 5 is connected to the steering knuckle 7 which includes the spindle of axle 8 about which the front road wheel 9 rotates. The steering knuckle 7 is pivotally mounted to the vehicle's frame through a suspension system (not shown) in a conventional manner.

In operation, the rotation of the steering wheel 1 produces a displacement of the Pittman arm 4 by means of the steering box 2 which in turn rotatably displaces the steering arm 5 and pivots the steering knuckle 7 about a vertical axis to turn the front road wheel 9.

The electro/pneumatic power steering system comprises a pneumatic cylinder 10 having one end pivotally connected to a bracket 12 attached to the vehicle's frame 14. The pneumatic cylinder's push rod 16 is connected to the steering arm 5 so that extension or retraction of push rod 16 will pivot the steering knuckle 7 about its vertical axis in the same manner as the displacement by the tie rod 6 connected to the steering box's Pittman arm 4. The internal end of the push rod 16 is connected to the pneumatic cylinder's piston 18 which is displaceable to extend or retract the push rod 16 in response to the pressure differential on the opposite sides thereof.

The pressure on the opposite sides of the pneumatic cylinder's piston is controlled by a pair of electro/pneumatic proportional valves 20 and 22 receiving air from the vehicle's source of pressurized air. The proportionally valves 20 and 22 are electrically controlled so that they compliment each other, that is, when one is supplying pressurized air to one side of the piston 18, the other is exhausting the other side of the piston to the atmosphere and vice versa.

The proportional valves 20 and 22, the details of which will be explained later, are electrically controlled by an electronic controller 24 in response to the signals generated by a torque sensor 26 attached to the steering column 3.

The operation of the electro-pneumatic power steering system is as follows: When the operator turns the steering wheel 1 to affect the turning of the vehicle's front road wheels 9, a torque is generated on the steering column 3 due to the friction between the road wheels 9 and the road surface. The torque sensor 26 senses the torque applied to the steering column 3 and generates a torque signal having a polarity indicative of the direction and an amplitude indicative of the magnitude of the applied torque. The electronic controller 26 responds to the torque signal generated by the torque sensor and generates either a first pulse train activating proportional valve 20 or a second pulse train activating proportional valve 22 dependent upon polarity of the torque signal. The width (pulse duration) of the individual pulses in either pulse train signal is indicative of the amplitude of the torque signal above a predetermined value independant of its polarity.

The electronic controller 26 will not generate a pulse train for either proportional valve when the torque signal has an amplitude of either polarity less than the predetermined value. This creates an effective dead band about the zero torque value in which the electro/pneumatic power steering system does not provide any assist in turning the vehicle's road wheel preserving for the operator a normal feel of the road when only small steering corrections are required, such as during highway driving.

The proportional valves 20 and 22 are designed so that in the absence of the pulse train signal, the chambers of the pneumatic cylinder to which they are connected are exhausted to the atmosphere. Therefore when the amplitude of the torque signal is below the predetermined value, and the controller is not generating either pulse train signal, the chambers on both sides of the piston 18 in the pneumatic cylinder 10 are exhausted to the atmosphere. In this state the pneumatic cylinder 10 does not offer any resistance to the steering of the vehicle's wheels via the normal steering linkage consisting of steering wheel 1, steering column 3, steering box 2, Pittman arm 4, and tie rod 6.

In response to a pluse train signal from the controller 26, one of the proportional valves will close its exhaust port and supply pressurized air to the associated chamber of the pneumatic cylinder 10 which will produce a force biasing the piston 18 to move. This force is transmitted to the steering arm 5 of the steering knuckle 7 by push rod 16 and assists the driver in turning the vehicle's wheels in the desired direction. As previously discussed, the two pulse train signals are generated in the mutually exclusive such that when the controller is generating the first pulse train signal applied to proportional valve 20, the second pulse train signal applied to proportional valve 22 is effectively zero and the exhaust port of proportional valve 22 remains open, and vice versa. The pressure of air provided to the pneumatic cylinder 10 by either proportional valve 20 or 22 is proportional to the pulse widths of the individual pulses in the pulse train signal as shall be explained with reference to FIGS. 2 to 5.

Upon completion of the turn, the torque on the steering column will return to zero, terminating the generation of pulse train signal, and the exhaust port of the activated proportional valve will open exhausting the pressurized chamber of the pneumatic cylinder. In this state, if the vehicle is moving, the toe-in of the front wheels will return the wheels to their neutral position without any impedance from the electro/pneumatic power steering system, otherwise the wheels will remain in their last position until the operator again applies a torque to the steering wheels.

The details of the electro/pneumatic proportional valves 20 and 22 are shown on FIGS. 2 through 5. Referring first to FIG. 2, the electro/pneumatic proportional valve 20 or 22 has a generally cylindrical cup shaped housing 30 and a cover 32. The housing 30 has an intermediate web 34 which divides the interior of the housing into an upper chamber 36 and a lower chamber 38. The housing 30 has an outlet port 40 which is connected to one of the chambers in the pneumatic cylinder 10 and an inlet port 42 adapted to receive pressurized air from the vehicle's source of pressurized air. The web 34 has a central aperture 44 for receiving therethrough a pintle 46 connected to a piston 48 disposed in the upper chamber 36 above the outlet port 40. The pintle 46 has a guide finger 47 which is slidably received in the bore of an exhaust cylinder 50 disposed in the lower chamber 38 below web 34.

Figure 5:
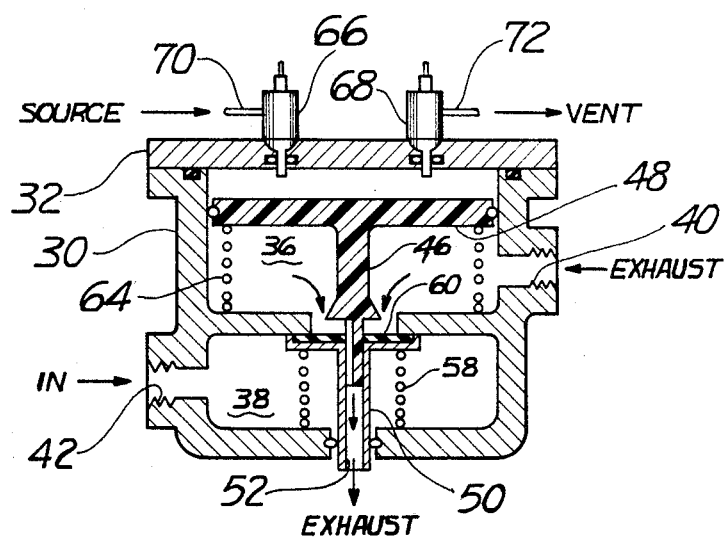
FIG. 5 is a cross-sectional view of the electro/pneumatic proportional valve in the initial or first state

The guide finger 47, is in the form of a three pointed star, as shown in FIG. 3, and allows air to flow through the exhaust cylinder when pintle 46 is partially extracted as shown on FIG. 5. The exhaust cylinder 50 has an internal bore 52 and a flange portion 54. The lower portion of the exhaust cylinder 50 passes through an exhaust port 56 provided through the bottom of the housing 30 as shown, venting the internal bore 52 to the atmosphere. A resilient annular seal 60 is attached to the upper surface of the exhaust cylinder's flange portion 54 and engages the lower surface of web 34 about the periphery of central aperture 44 and the bottom of pintle 46 as shown.

A resilient spring 58 disposed between the bottom of housing 30 and the lower surface of the flange portion 54 biases the exhaust cylinder 50 upwardly compressing annular seal 60 against the bottom surface of the web 34 to seal the bottom chamber 38 from the upper chamber 36. A resilient seal, such as O-ring 61 is provided about the periphery of piston 48 to engage the inner surface of housing 30 pneumatically isolating the upper and lower portions of chamber 36 either side of piston 48. In a like manner a resilient seal, such as O-ring 62 is provided between the exhaust cylinder 50 and the exhaust port 56 to pneumatically seal the lower chamber 38 at the point where the exhaust cylinder 50 passes through housing 30.

A resilient spring 64 is disposed between the upper surface of web 34 and the lower surface of piston 48 to bias the piston 48 and pintle 46 upwardly away from the upper surface of the annular seal 60 attached to the exhaust cylinder 50 as shown in FIG. 5. In the state of the proportional valve shown on FIG. 5, the outlet port 40 is in direct fluid communication with the internal bore 52 and permits the proportional valve 20 to exhaust the chamber of the pneumatic cylinder 10 to which it is connected through exhaust port 56.

As shown in FIG. 2, two high speed electrically actuated pilot waves 66 and 68, such as disclosed in patent application Ser. No. 535,009 filed Sept. 23, 1983, are mounted to the cover 32 and adapted to be in communication with chamber 36 above the piston 48. pilot valve 66 is a normally closed valve and receives pressurized air from the vehicle's source of pressurized air via input line 70. Pilot valve 68 is a normally open valve and exhausts chamber 36 via exhaust line 72. The associated pulse train signal generated by the controller 24 is connected in common to both pilot valves 66 and 68 by electrical lead 74.

Pilot valve 66 opens and pilot valve 68 closed in response to the individual pulses of the pulse train signal pressurizing the chamber 36 above the piston 48 causing the piston descend against the force of spring 64 as shown in FIG. 4. When the piston 48 is displaced downwardly, the pintle 46 engages the upper surface of annular seal 60 blocking the exhaust cylinder's bore 52 as shown in FIG. 2. Continued descent of the pintle 46 unseats the annular seal 60 from the web 34 as shown in FIG. 4. The unseating of the annular seal 60 from web 34 opens an air path between the upper and lower chambers through aperture 44 permitting the pressurized air input to the lower chamber 38 through inlet port 42 to flow into the upper chamber 36 and out the outlet port 40 to the pneumatic cylinder 10.

The portion of the upper chamber 36 above the piston 48 acts as pressure integrator such that the pressure applied to piston 48 is a function of the ON and OFF times of pilot valves 66 and 68. Once the annular seal 60 is displaced from web 34, the pressurized air from the lower chamber 36 will flow into the upper chamber 36 below the piston 48 producing a force urging the piston 48 upward until the forces acting on the opposite sides of piston 48 are equal. The piston will then maintain this position and the pressure of the air exiting the outlet port 40 will be approximately equal to the pressure of the air above the piston 48 minus the force exerted by spring 64. The pressure above the piston 48, as previously discussed is a function of the pulse width or duration of the pulses in the pulse train generated by controller 24.

The operation of the proportional valve is as follows: In its unactivated state, as shown in FIG. 5, spring 58 urges the exhaust cylinder upward causing annular seal 60 to engage the lower surface of the web 34 occluding aperature 44 and isolating the upper chamber 36 from the pressurized air received at the inlet port 42. Simultaneously spring 64 urges piston 48 upward unseating the pintle 46 from the annular seal 60 opening a fluid passageway between the lower portion of chamber 36 below piston 48 and the exhaust cylinder's internal bore 52. Since the outlet port 40 connects with the lower portion of chamber 36, the outlet 40 is vented to the atmosphere through the exhaust cylinder's internal bore 52.

Upon the initial activation of the pilot valves 66 and 68 by a pulse train signal generated by the controller 24, the upper portion of chamber 36 above piston 48 is pressurized causing piston 48 and pintle 46 to descend against the force of spring 64. At a predetermined pressure determined by the spring rate of spring 64 the pintle 46 will engage the annular seal 60 and occlude the exhaust port 52 as shown in FIG. 2. In this state the pintle has not descended far enough to unseat the annular seal 60 from web 34 and the flow of pressurized air to the outlet port 40 remains blocked. This initial movement of the piston 48 without producing an output at the outlet port constitutes a second deadband about the zero torque level which is added to the first deadband generated by the controller 24. It is recognized that by appropriate selection of the spring rate of spring 64 the deadband generated in the controller 24 may be eliminated, however, it is preferred that some latitude in adjusting the width of the deadband remain in the controller 24 to accomodate the operator's preference and to compensate for mechanical variations in the spring rate of spring 64.

Increasing the pressure in the portion of chamber 36 above piston 48 so that it exceeds the predetermined pressure will cause the piston 48 to descend and displace the annular seal 60 from the lower surface of web 34 allowing the pressurized air from the lower chamber 38 to flow into the upper chamber 36 and out the outlet port 40 as shown in FIG. 4. The air pressure in the lower portion of chamber 36 and output at outlet port 40 is equal to the pressure above piston 48 minus the force exerted by spring 64. Thereafter the air pressure at outlet port 40 will be proportional to the air pressure above piston 48 which is determined by the width of the pulses in the pulse train applied to pilot valves 66 and 68. In an alternate embodiment, spring 64 may be eliminated and the piston 48 will be raised to the position shown on FIG. 5 due to the residual pressure in cylinder 10 after the pulse train signal is terminated which vents the portion of chamber 36 above piston 48 to the atmosphere.

It is not necessary that pilot valve 68 be a normally open valve, but alternatively it may be a normally closed valve identical to pilot valve 66. Under these conditions, the controller is required to generate two pulse train signals for each proportional valve, one being the logical compliment of the other. One of the pulse train signals is then applied to pilot valve 66 and its compliment applied to pilot valve 68. However, it is preferred that pilot valve 68 be a normally open valve for safety reasons. In the event of a power failure, the normally open pilot valve will vent the portion of chamber 36 above the piston causing the proportional valve to assume the initial state in which the outlet port 40 is vented to the atmosphere. This safety feature will prevent the pneumatic cylinder from being locked in any one position and will enable the vehicle operator to maintain control of the vehicle through the mechanical steering linkages in the event of either an electrical or pneumatical power failure.

In an alternate embodiment of the proportional valve 20 or 22 shown on FIG. 4 the pilot valves 66 and 68 are housed in an auxiliary housing 76 fixedly attached to cover 32 by means of screws or similar fastners (not shown). The auxiliary housing 76 has a blind bore 78 which connects with chamber 36 through a mating aperture 80 formed through the cover 32. Passageways extending radially from blind bore 78 connect the active ends of the pilot valves 66 and 68 with blind bore 78 and chamber 36 above piston. Plates 82 and 84 fixedly attached to auxiliary housing 76 using screws (not shown) or other appropriate fasteners captivates the pilot valves 66 and 68 in housing 76.

The operation of the alternate embodiment shown on FIG. 4 is identical to the operation of the embodiment shown on FIG. 2 and need not be repeated for an understanding of the invention.

It is also recognized that a single pilot valve may also be used in place of the two pilot valves 66 and 68. This single pilot valve would have an unactuated state venting the chamber 36 to the atmosphere and an actuated state supplying pressurized air to chamber 36 above piston 48.

Figure 6:
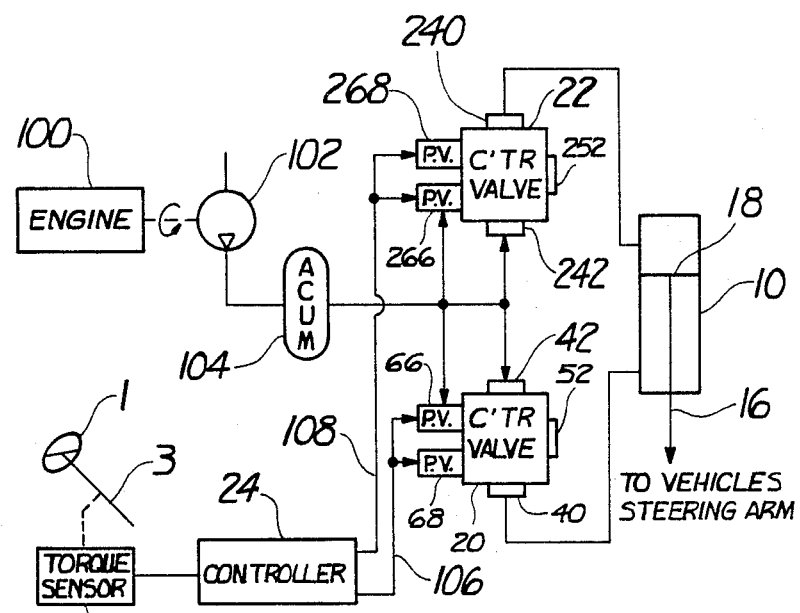
FIG. 6 is a block diagram of the electro/pneumatic power steering system

FIG. 6 is an electro/pneumatic block diagram of the electro/pneumatic power steering system. Referring to FIG. 6, the vehicle's engine 100 drives a pneumatic pump 102 which pressurizes a pneumatic or air accumulator 104 which constitutes the vehicle's source of pressurized air referred to previously. The output of the accumulator 104 is connected to inlets 42 and 242 of the proportional valves 20 and 22 respectively and to the inlets of pilot valves 66 and 266 which are the pilot valves associated with proportional valves 20 and 22 respectively. In this explaination the elements associated with proportional valve 22 are prefixed with the numeral 2, to distinguish them from the identical elements of proportional valve 20. For example, pilot valve 66 associated with proportional valve 22 is identified by the reference numeral 266 while the identical pilot valve associated with proportional valve 20 is identified with numeral 66 as shown in FIG. 2.

The outlet 40 of proportional valve 20 is connected to one end of pneumatic cylinder 10 while the outlet 240 of proportional valve 22 is connected to the other end of pneumatic cylinder 10 on opposite sides of piston 18.

The torque sensor 26 detects the torque applied to the vehicles steering column 3 by the turning of steering wheel 1 and generates a torque signal. This torque signal is transmitted to controller 24 which generates one of a pair of pulse train signals indicative of the direction and magnitude of the detected torque. The first pulse train signal is transmitted to the pilot valves 66 and 68 associated with proportional valve 20 via lead 106 while the second pulse train signal is transmitted to pilot valves 266 and 268 associated with proportional valve 22 via lead 108.

As previously discussed proportional valves 20 and 22 pressurize one or the other end of pneumatic cylinder 10 in response to the controller 24 generating either a first or second pulse train signal to displace the pneumatic cylinder's piston 18 and push rod 16 to assist the operator in steering the vehicle. In the absence of both the first and second pulse train signals, the proportional valves 20 and 22 vent the opposite ends of pneumatic cylinder 10 to the atmosphere terminating the authority of the electro/pneumatic steering system allowing the operator to steer the vehicle using only the conventional mechanical steering linkages.

Figure 7:
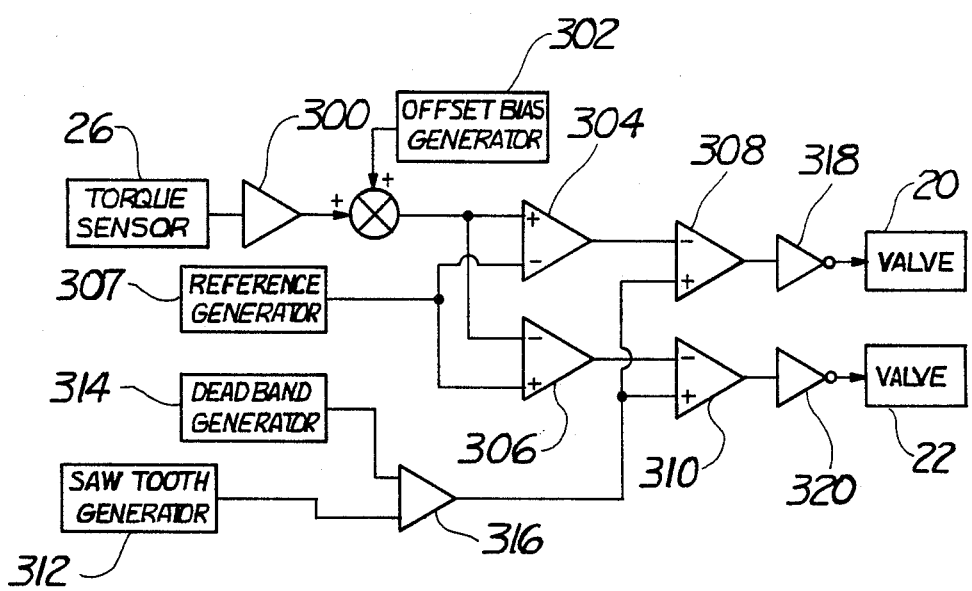
FIG. 7 is a block-diagram of the electronic controller

FIG. 7 is a block diagram of controller 24. Referring to FIG. 7, the torque sensor 26 generates a torque signal having a polarity indicative of the direction of the applied torque and an amplitude indicative of the magnitude. This torque signal is amplified by amplifier 300 to generate an amplified torque signal. The output of amplifier 300 is then summed with an offset bias signal generated by Offset Bias Generator 302 to generate a biased torque signal 303 in which the midscale value of the biased torque signal corresponds to a zero amplitude of the torque sensor's torque signal as shown in FIG. 9. The biased torque signal 303 is applied to the positive input of a first difference amplifier 304 and the negative input of a second difference amplifier 306.

A Reference Generator 307 generates reference signals which are applied to the negative input of difference amplifier 304 and the positive input of difference amplifier 306. Difference amplifier 304 will only output a positive difference signal in response to a biased torque signal having a value greater than the reference signal generated by Reference Signal Generator 307 while difference amplifier 306 will only generate a positive difference signal when the biased torque signal has a value less than the reference signal. Preferably the reference signals have a value corresponding to the offset bias signal. The difference signal outputs of difference amplifiers 304 and 306 are connected to the negative inputs of comparators 308 and 310.

A Saw Tooth Generator 312 generates a repetitious saw tooth wave at a predetermined frequency. The valleys of the saw tooth wave are clipped by a Clipping Amplifier 316 to have a minimum value determined by a signal generated by a Dead Band Bias Generator 314 to generate a clipped saw tooth wave 316 as shown on FIG. 10b. The clipped saw tooth wave 316 is received at the positive inputs of comparators 308 and 310.

Comparator 308 and 310 will generate a positive signal as long as the value of the difference signal output from their associated difference amplifiers 304 and 306 respectively is less than the instantaneous value of the clipped saw tooth wave 316 and will generate a pulse train signal in which the pulse width of the individual pulses 322 are inversely proportional to the magnitude of the difference signal output from its associated difference amplifier as shown on FIG. 10c.

The outputs of Comparators 308 and 310 are connected to Power Amplifiers 318 and 320 which invert the output of Comparator 308 and 310 to generate the first and second pulse train signals respectively in which the pulse widths of the individual pulses 224 are proportional to the magnitude of the torque signals as shown in FIG. 10d.

Since the valleys of the saw tooth wave are clipped by the signal from the Dead Band Bias Generator 314 such that the valleys of the saw tooth wave have a predetermined mimimum positive voltage, torque signals output from difference amplifiers 304 and 306 having a value less than this predetermined value will cause comparator 308 or 310 to generate a continuous positive output signal which when inverted by the Power Amplifiers 312 and 314 is a null signal. The clipping of the valleys the saw tooth wave therefore provides the desired dead band about the zero torque value.

Figure 8:
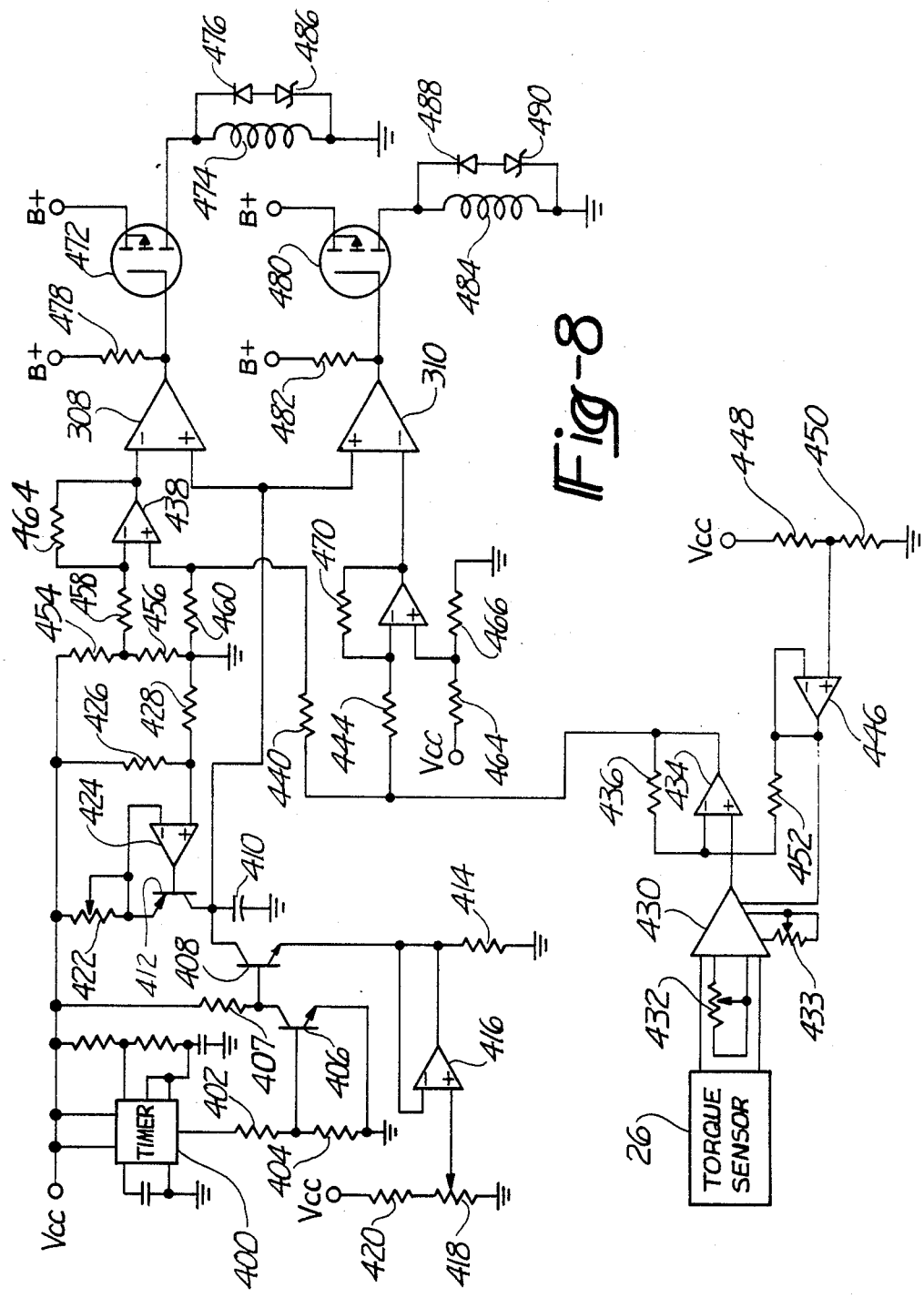
FIG. 8 is a circuit diagram of the electronic controller

The circuit diagram of the controller 24 is shown on FIG. 8. Referring to FIG. 8, the controller circuit comprises a Timer 400 such as National Semiconductor LM 555 having it's output connected to ground by means of a pair of resistors 402 and 404. The junction between resistors 402 and 404 is connected to ground by means of a pair of resistors 402 and 404. The junction between resistors 404 and 404 is connected to the base of a transistor 406 having is collector connected to a regulated positive supply of electrical power designated $V_{cc}$ through a resistor 407 and its emitter connected to ground. Regulated power supply terminals shown on FIG. 8 are designated $V_{cc}$ while the unregulated power supply terminals are designated B+. The collector of transistor 406 is also connected to the base of a second transistor 408 having its collector connected to one electrode of capacitor 410 and the collector of a third transistor 412. The other electrode of capacitor 410 is connected to ground. The emitter of transistor 408 is connected to ground through resistor 414 and to the output and negative input of operational amplifier 416. The positive input terminal of operational amplifier 416 is connected to the movable contact of potentiometer 418 which is connected in series with resistor 420 to form a voltage divider between $V_{cc}$ and ground.

Transistor 412 has its emitter connected to $V_{cc}$ through potentiometer 422 and directly to the negative input of operational amplifier 424, and the movable contact of potentiometer 422. The output of operational amplifier 424 is connected to the base of transistor 412 and its positive input is connected to the junction of serially connected resistors 426 and 428 forming a voltage divider between $V_{cc}$ and ground. Operational amplifier 424, transistor 412, potentiometer 422 and resistors 426 and 428 form a constant current source charging capacitance 410.

The torque sensor 26, such as, a Wheatstone bridge type strain gauge, is connected to operational amplifier 430 such as Analog Device AD521. A potentiometer 432 may be connected across alternate inputs to operational amplifier 430 to adjust the gain of this type of amplifier as is known in the art. In a similar manner potentiometer 433 may be connected to alternate inputs of Operational Amplifier 430 to trim the bias potential of its output signal. The output of operational amplifier 430 is connected to a positive input of operational amplifier 434 which has its output connected back to its negative input through resistance 436. The output of operational amplifier 434 is also connected to the positive input of operational amplifier 438 through resistor 440 and to the negative input of operational amplifier 442 through a resistor 444. Operational amplifiers 438 and 442 are difference amplifier 304 and 306 respectively shown in FIG. 7.

Operational amplifier 446 has its positive input connected to the junction of serial connected resistors 448 and 450 forming a voltage divider between $V_{cc}$ and ground. The output of operational amplifier 446 is connected directly back to its negative input and to operational amplifier 430 to provide a bias potential biasing the output of operational amplifier 430 about a midpoint voltage determined by resistors 448 and 450. The output of operational amplifier 446 is also connected to the negative input of operational amplifier 434 through resistor 452.

Operational amplifier 438 has its negative input connected to the junction between serially connected resistors 454 and 456 through resistor 458. Resistors 454 and 456 form a voltage divider between $V_{cc}$ and ground. The positive input to operational amplifier 438 is connected to the output of operational amplifier 434 through resistor 440 as previously described and is connected to ground through resistor 460. The output of operational amplifier 438 is connected to the negative input of Comparator 308, such as National Semiconductor LM903, and back to its negative input resistor 464.

Operational amplifier 442 has its positive input connected to the junction between serially connected resistors 464 and 466 which form a voltage divider between $V_{cc}$ and ground. The output of operational amplifier 442 is connected to the negative input of comparator 310 and back to its negative input through resistance 470. Comparator 310 is identical to comparator 308.

The positive inputs of comparators 308 and 310 are connected to the one electrode of capacitance 410 which is charged by the constant current source. The output of comparator 308 is connected to the gate of a "p" type MOSFET transistor 472 such as International Rectifier IRF9530 having its drain connected to solenoid coil 474 of Pilot valve 20 and its source conected to B+. A diode 476 is connected back to back with Zener diode 486 between the source and drain electrode of transistor 472 and ground to protect transistor 472 from the inductive flyback of solenoid coil 474 when transistor 472 is turned off. The output of comparator 462 is also connected to B+ through resistor 478.

In a like manner comparator 310 has its output connected to the gate of "p" type MOSFET transistor 480 and to B+ through resistor 482. The drain of MOSFET transistor is connected to the solenoid coil 484 of Pilot valve 22 and its source in connected B+. Diode 488 is connected back to back with a Zener diode 490 between the drain electrode of transistor 480 and ground to protect it from the inductive flyback of solenoid coil 484 when transistor 480 is turned off. FET transistor 472 constitute inverter amplifier 318 shown on FIG. 7 while FET transistor 480 constitutes inverter amplifier 320.

The operation of the controller is as follows: Timer 400 sequentially generates positive pulses approximately 60 milliseconds in duration followed by a null for approximately 1 millisecond as shown on FIG. 10a. The positive pulses are applied to the base of transistor 406 causing it to be conductive and rendering transistor 408 non-conductive. When transistor 408 is non-conductive, capacitor 410 is charged by the constant current source through transistor 412. At the end of each pulse generated by the Timer 400, its output goes to zero biasing transistor 406 off rendering transistor 408 conductive and discharging capacitance 410 to a voltage determined by the potential applied to the positive input of operational amplifier 416 from the wiper contact of potentometer 418. Operational amplifier 416 is connected to act as a voltage follower and determines the minimum discharge voltage of capacitor 410 during this period. Operational amplifier 416, potentiometer 418 and resistors 414 and 420 constitute the Dead Band Generator 302 shown on FIG. 7.

The capacitor 410 is charged by the constant current source during each sequential positive pulse output from Timer 400 to generate the saw tooth wave 316 as shown on FIG. 10b. Transistors 406 and 408 effectively comprise clipping amplifier 318 of FIG. 7 limiting the minimum value of the saw tooth wave to the potential at the wiper of potentiometer 418. The Timer 400, constant current source comprising transistor 412 and operational amplifier 424 and capacitor 410 constitute the Saw Tooth Generator 312 shown on FIG. 7. The saw tooth wave 316 generated across capacitor 410 is applied to the positive inputs of comparators 308 and 310.

The torque signal generated by torque sensor 26 is amplified by operational amplifiers 430 and 436 which constitute amplifier 300 shown in FIG. 7. Operational amplifier 446 functions as a voltage follower which generates a voltage biasing the amplified torque signal generated by the operational amplifiers 430 and 434 about a voltage determined by resistors 448 and 450. Preferably, the resistance values of resistors 448 and 450 are equal so that the voltage at the output of operational amplifier 446 is equal to ½ $V_{cc}$. Operational amplifier 446 and resistor 448 and 450 constitute the Offset Bias Generator 302 shown on FIG. 7. The output signal of operational amplifier 434 has a positive value which may vary either side of the voltage ½ $V_{cc}$ depending on the amplitude and polarity of the torque signal generated by the torque sensor as shown on FIG. 9.

The amplified torque signal generated by operational amplifier 434 is further amplified by operational amplifier 438 and 442 which act as difference amplifiers 304 and 306 shown on FIG. 7. Operational amplifier 438 generates a positive difference signal in response to the biased torque signal exceeding the potential applied to its negative input determined by resistors 454 and 456. Preferably the resistance valves of resistors 454 and 456 are equal so that the potential applied to the negative input of operational amplifier is approximately ½ $V_{cc}$.

In contrast, the biased torque signal applied to the negative input of operational amplifier 442 generates a positive difference signal when the amplitude of the biased torque signal is less than the potential applied to its positive input determined by resistors 464 and 466. Preferably the resistance values of resistors 464 and 466 are selected so that the potential applied to the positive input of operational amplifier is ¼ $V_{cc}$ which is multiplied by 2 by the feedback arrangement of amplifier 442 to produce an effective value of ½ $V_{cc}$ as is known in the art.

The output of operational amplifier 438 is a positive difference signal having an amplitude proportional to the amplitude of a torque signal when the torque signal generated by the torque sensor 26 has a positive polarity. Similarly the output of operational amplifier 442 is a positive difference signal having an amplitude proportional to the amplitude of the torque signal when the torque signal generated by the torque sensor 26 has a negative polarity.

As previously described the saw tooth wave generated across capacitor 410 is applied to the positive inputs to comparators 308 and 310 while the difference signals generated by operational amplifiers 438 and 442 are applied to the negative inputs of comparators 308 and 310 respectively. When the instantaneous value of the saw tooth wave applied to the positive inputs of comparators 308 and 310 is less than the torque signals applied to their respective negative inputs as shown on FIG. 10b, the output of the comparators 462 and 468 apply a ground potential to the gates of FET transistors 472 and 480 respectively as shown on FIG. 10c. This ground potential renders FET transistors 472 and 480 conductive to produce the pulse train signal shown on FIG. 10d activating their associated pilot valve. When the instantaneous value of the saw tooth wave exceeds the value of the difference signal applied to the respective negative inputs of comparators 308 or 310, the outputs of the comparators apply a B+ potential to the gates at their respective FET transistors 472 or 480 which render them non-conductive thereby deactivating the solenoids of the associated pilot valves.

As previously indicated, the saw tooth wave is clipped by transistor 408 so that its minimum value is a predetermined positive potential as shown on FIG. 10b, therefore the FET transistors 472 or 480 will only be turned on or made conductive when the difference signal has a potential greater than this predetermined positive potential. Otherwise for difference signals having a potential less than the predetermined potential the value of the saw tooth wave, the saw tooth wave will always be greater then the value of the difference signal. For these values Comparators 308 and 310 will generate a continuous positive signal and the FET transistors 472 and 480 will remain non-conductive. This creates a deadband about the zero torque value in which the proportional valves 20 and 22 remain inactive and both ends of the pneumatic cylinder 10 are vented to the atmosphere. The width of the deadband may be adjusted by the operator by potentiometer 418 which controls the potential to which capacitor 410 is discharged or clipped.

Having described the invention in detail, it is acknowledged that others skilled in the art may modify or make other changes to the controller shown in the drawings and described in the specification without departing from the spirit of the invention, as set forth in the appended claims.

We claim:

1. A controller for alternatively generating a pair of pulse train signal in response to an input signal having a direction component and a magnitude component; comprising offset means for biasing the input signal to generate a biased input signal such that the magnitude component corresponding to a zero magnitude has a midpoint value;

saw tooth generator means for generating a saw tooth wave having a predetermined repetition rate;

deadband generator means for generating a clipping signal having a predetermined value;

a clipping amplifier responsive to said saw tooth wave and said clipping signal for generating a clipped saw tooth wave in which minimum value of said saw tooth wave is limited to said predetermined value;

reference signal generator means for generating at least two reference signals having values corresponding to said midpoint value;

first difference amplifier means generating a first difference signal having an amplitude proportional to the difference between one of said reference signals and said biased input signal;

second difference amplifier means for generating a second difference signal having an amplitude inversely proportional to the difference between the other of said reference signals and said biased input signal;

first comparator means for generating a first pulse train signal in response to said first difference signal having an amplitude greater than the instantanious value of said clipped saw tooth wave, each pulse in said first pulse train signal having a duration proportional to amplitude of said first difference signal;

second comparator means for generating a second pulse train signal in response to said second difference signal having an amplitude greater than the instantaneous value of said clipped saw tooth, wave, each pulse in said second pulse train signal having a duration proportional to the amplitude of said second difference signal.

2. The controller of claim 1 wherein said saw tooth generator means comprises;

a capacitor having one electrode connected to ground and a second electrode;

a current source connected to said second electrode to charge said capacitor at a predetermined rate;

timer means for respectively generating timer pulses at a predetermined frequency; and first transistor means responsive to said timer pulses to periodically discharge said capacitor in the interval between sucessive timer pulse.

3. The controller of claim 2 wherein said deadband generator comprises:

a first voltage divider for generating a voltage equal to said predetermined minimum value;

a resistance connected between said first transistor means and ground; and a voltage follower having its input connected to said voltage divider and its output connected to the junction between said resistance and said first transistor to control the discharge potential of said capacitor equal to said predetermined minimum value.

4. The controller of claim 3 wherein said first voltage divider comprises a serially connected resistance and potentiometer and wherein the movable contact of said potentiometer is connected to the input of said voltage follower to permit said predetermined minimum value to be manually adjusted.

5. The controller of claim 2 wherein said current source is a constant current source.

6. The controller of claim 1 wherein said offset means comprises:

pre-amplifier means for amplifying the input signal to generate an amplified input signal;

a second voltage divider generating said midpoint voltage, and a voltage follower having its input connected to said second voltage divider and its output connected to said pre-amplifier means to bias said amplified input signal about said offset voltage so that the magnitude component indicative of a zero magnitude component has said midpoint voltage.

7. The controller of claim 6 wherein the direction component of the input signal is the polarity of the input signal and the magnitude component is the amplitude of the input signal, said second voltage divider generates an offset voltage equal to said midpoint voltage.

8. The controller of claim 1 wherein said first difference amplifier means is a first operational amplifier receiving said biased input signal at its positive input and said one reference signal at its negative input to generate said first output signal and wherein said second difference amplifier is a second operational amplifier receiving said biased input signal at its negative input and said other reference signal at its positive input.

9. The controller of claim 8 wherein each of said comparators means comprises;

a comparator circuit receiving said clipped saw tooth wave at its positive input and one of said first and second difference signals at its negative input to generate a comparator output signal when the value of said clipped saw tooth wave is greater than the received one of said first and second difference signals; and inverter amplifier means for amplifying and inverting said comparator output signal.

10. The controller of claim 9, wherein said inverter amplifier is a "p" type field effect transistor receiving said comparator output signal at its gate electrode.

11. An electro/pneumatic power steering system controller for generating two mutually independant pulse train signals in response to a torque signal generated by a steering column torque sensor, the torque signal having a first component indicative of the direction of the torque and a second component indicative of the magnitude of the torque, the controller comprising:

amplifier means responsive to the torque signal for generating an amplified torque signal offset bias generator means for biasing said amplified torque signal to generate a biased torque signal in which the torque signal indicative of zero torque has a midpoint value;

saw tooth generator means for generating a saw tooth wave having a predetermined frequency, the valleys of said saw tooth wave being clipped to have a predetermined non-zero value reference signal generator means for generating a pair of reference signals having values corresponding to said midpoint value;

a first difference amplifier for generating a first difference signal having an amplitude proportional to the difference between one of said reference signals and said biased signal;

a second difference amplifier for generating a second difference signal having an amplitude inversely proportional to the difference between the other said reference signals and said biased signal;

first comparator means for generating a first pulse wave train signal in response to said first difference signal being greater than the instantaneous value of said saw tooth wave; and second comparator means for generating a second pulse wave train signal in response to said second difference signal being greater than the instantaneous value of said saw tooth wave.

12. The controller of claim 11 wherein said saw tooth generator means comprises:

a capacitor having one electrode connected to ground and a second electrode;

a current source connected to said second electrode to charge said capacitor at a predetermined rate;

timer means for repeatedly generating timer pulses at a predetermined frequency;

first transistor means responsive to said timer pulses to periodically charge and discharge said capacitor;

dead band generator means for generating a clipping signal having a predetermined value; and a clipping amplifier responsive to said clipping signal limiting the discharge of said capacitor by said first transistor means to said predetermined value.

13. The controller of claim 12 wherein said dead band generator means have means for varying the predetermined value of said clipping signal.

14. The controller of claim 11 wherein said first difference amplifier is a first operational amplifier receiving said biased torque signal at its positive input and said one of said reference signals at its negative input to generate said first difference signal having a value corresponding to the difference between said biased torque signal and said midpoint value and wherein said second difference amplifier is an operational amplifier receiving said biased torque signal at its negative input and the other of second of said reference signals at its positive input to generate said second difference signal having a value inversely proportional to the difference between said biased torque signal and said midpoint value.

15. the controller of claim 14 wherein each of said first and second comparators comprises;

a comparator circuit receiving said saw tooth wave at its positive input and one of said first and second difference signals at its negative input to generate a comparator output signal when the value of said saw tooth wave is greater than the received one of said first and second difference signals; and inverter amplifier means for amplifying and inverting said comparator output signal to generate one of said first and second pulse train signals.

16. The controller of claim 15 wherein said inverter amplifier is a "p" type field effect transistor receiving said comparator output signal at its gate.

17. The controller of claim 16 wherein the first component of said torque signal is its polarity and the second component of said torque is its amplitude, said offset bias generator means biases the amplitude component indicative of a zero torque about said midpoint value such that a torque signal of the first polarity has a magnitude component equal to the midpoint value plus its amplitude and that a torque signal of the reverse polarity has a magnitude component equal to the midpoint value minus its amplitude.

* * * * *